(12) United States Patent
Maniwa et al.

(10) Patent No.: US 8,535,987 B2
(45) Date of Patent: Sep. 17, 2013

(54) METHOD OF MANUFACTURING SUBSTRATE FOR SEMICONDUCTOR ELEMENT, AND SEMICONDUCTOR DEVICE

(75) Inventors: Susumu Maniwa, Kasukabe (JP); Takehito Tsukamoto, Tokorozawa (JP); Junko Toda, Kasukabe (JP)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 13/249,925

(22) Filed: Sep. 30, 2011

(65) Prior Publication Data

US 2012/0061829 A1 Mar. 15, 2012

Related U.S. Application Data

(63) Continuation of application No. PCT/JP2010/001810, filed on Mar. 15, 2010.

(30) Foreign Application Priority Data

Mar. 30, 2009 (JP) ................................ P2009-081785

(51) Int. Cl.
*H01L 21/00* (2006.01)

(52) U.S. Cl.
USPC .................. 438/123; 257/676; 257/E33.066; 257/E23.052

(58) Field of Classification Search
USPC ......... 438/106, 111, 112, 123, 127; 257/666, 257/676, E33.066, E23.052
See application file for complete search history.

(56) References Cited

U.S. PATENT DOCUMENTS

| 6,451,627 | B1 * | 9/2002 | Coffman ........................ 438/111 |
| 2008/0264678 | A1 * | 10/2008 | Iijima et al. .................... 174/254 |

FOREIGN PATENT DOCUMENTS

| JP | 6-326142 | 11/1994 |
| JP | 9-307043 | 11/1997 |
| JP | 10-022440 | 1/1998 |
| JP | 2006-303216 | 11/2006 |
| TW | 411748 | 11/2000 |

OTHER PUBLICATIONS

International Search Report for PCT/JP2010/001810 mailed Apr. 20, 2010.
Taiwanese Office Action mailed Mar. 14, 2013 in corresponding Taiwanese Application No. 099108814.

* cited by examiner

Primary Examiner — Brook Kebede

(57) ABSTRACT

A manufacturing method of a substrate for a semiconductor element, wherein a first step includes: forming a first and second photosensitive resin layer on a first and second surface of a metal plate, respectively; forming a first and second resist pattern on the first and second surface, for forming a connection post and a wiring pattern, respectively. A second step includes: forming the connection post and wiring pattern; filling in a premold liquid resin to the first surface which was etched; forming a premold resin layer by hardening the premold liquid resin; performing a grinding operation on the first surface, and exposing an upper bottom surface of the connection post from the premold resin layer. A groove structure is formed by the first and second steps, wherein a depth of the groove is up to an intermediate part in a thickness direction of the metal plate.

3 Claims, 5 Drawing Sheets

METHOD OF MANUFACTURING SUBSTRATE FOR SEMICONDUCTOR ELEMENT, AND SEMICONDUCTOR DEVICE

CROSS REFERENCE TO RELATED APPLICATIONS

This application is a continuation application, filed under 35 U.S.C. §111(a), of International Application No. PCT/JP2010/001810, filed Mar. 15, 2010, which claimed priority to Japanese Patent Application No. 2009-081785, filed Mar. 30, 2009, the disclosures of which are hereby incorporated by reference.

BACKGROUND OF THE INVENTION

1. Field of the Invention

The present invention relates to a substrate for a semiconductor element. The semiconductor element is mounted on the substrate. In particular, the present invention relates to a method for manufacturing a substrate which has structural characteristics that are similar to those of a lead frame. The present invention also relates to a semiconductor device using the substrate.

2. Description of the Related Art

Various types of semiconductor elements such as memory, CMOS, CPU, and the like, are manufactured by a wafer process. These semiconductor elements have a terminal for electrical connection. The magnitude of the pitch of the terminal for electrical connection is different from the magnitude of the pitch of the connection part at a print substrate side by approximately several to several hundred times. A semiconductor element is attached to the connection part at the print substrate side. Therefore, when the semiconductor element is about to be connected with the print substrate, an intermediary substrate (a substrate for mounting a semiconductor element) called an "interposer" is used for pitch conversion. The semiconductor element is mounted on one side of this interposer. A connection with the print substrate is made at another surface or a peripheral of the substrate. The interposer includes a metallic lead frame in the interior or at a front surface. An electrical connection channel is routed by the lead frame. In this way, the pitch of an external connection terminal is expanded. The external connection terminal makes a connection with the print substrate.

FIGS. 4A-4C are schematic diagrams showing a structure of an interposer using a QFN (Quad Flat Non-lead) type lead frame, which is an example of a conventional interposer. A flat part 15 of a lead frame is provided at a central part of a lead frame. The lead frame is formed primarily of either aluminum or copper. A semiconductor element 16 is mounted on the flat part 15 of the lead frame. A lead 17 with a wide pitch is placed at an outer peripheral part of the lead frame. A wire bonding method is used to connect the lead 17 and the terminal for electrical connection of the semiconductor element 16. The wire bonding method uses a metal wire 18 such as an Au line and the like. An overall integration is made at a final stage by performing a molding process with a molding resin 19.

When the semiconductor element has a small number of terminals, the connection between the print substrate and the interposer is conducted by attaching a metallic pin on an extraction electrode 20 at an external extension part of the interposer. Furthermore, when the semiconductor element has a large number of terminals, a Ball Grid Array is used. According to the Ball Grid Array, a solder ball is positioned in an array pattern at an external connection terminal at an outer peripheral part of the interposer.

When an area is small and there is a large number of terminals, a wiring layer may be configured to have multiple layers by stacking a plurality of layers. According to this method, it is possible to cope with a large number of terminals. However, the structure of the substrate becomes intricate. Hence, the reliability and stability are reduced. Thus, the above configuration is not suitable for mounting on a vehicle, for example, which requires a high degree of reliability.

Several types of interposers have been designed. The material used to create the interposer and the structure of the interposer are different. For example, an interposer is configured so that ceramic is used in the structure of a portion holding the lead frame part. Another type of interposer is configured so that the base material of the interposer is an organic substance such as P-BGA (Plastic Ball Grid Array), CSP (Chip Size Package), or LGA (Land Grid Array). These interposers are utilized as appropriate according to actual use and required configurations.

In any of these cases, as the size of semiconductor elements become smaller, as the number of pins increases, and/or as the speed of the semiconductor elements increases, adjustments are made by the interposers described above. For example, a fine pitching and an adjustment to high speed signals are made. The fine pitching is made to the connection part connecting with the semiconductor element of the interposer. Taking into consideration that the pitch has become more and more minute, it is necessary that the pitch of a terminal portion of recent interposers be approximately 80 to 120 μm.

Incidentally, the lead frame is used as a conduction part and a supporting component. It is preferable that the thickness of the lead frame be at least 100 μm to 120 μm, so that the etching process may be performed with stability, and so that an appropriate handling is made. Furthermore, a certain magnitude of the land is required to obtain an adequate amount of joint strength during the wire bonding process. Taking these conditions into consideration, it is believed that the pitch of the lead of the lead frame may be minimized to approximately 120 μm, while the width of the lead line may be made finer to approximately 60 μm.

Japanese Unexamined Patent Application, First Publication No. H10-022440, for example, discloses a substrate for a semiconductor element having a similar characteristic as the structure of a lead frame. According to Japanese Unexamined Patent Application, First Publication No. H10-022440, the structure of the substrate is such that a premold resin is a supporting body of a metal wiring. Thus, Japanese Unexamined Patent Application, First Publication No. H10-022440 discloses a method that can solve the problems described above and achieves an even finer pitch of the lead frame.

Hereinafter, a method, disclosed in Japanese Unexamined Patent Application, First Publication No. H10-022440, of manufacturing a substrate for a semiconductor element is described. A resist pattern for creating a connection post is formed on a first surface of a metal plate. A resist pattern for creating a wiring pattern is formed on a second surface. An etching process is performed on a copper to a desired thickness from above the first surface. Thereafter, a premold resin is filled into the first surface. In this way, a resin layer is formed. The thickness of the resin layer is made as thick as possible while the bottom surface of the connection post is exposed with certainty. Next, an etching process is performed on the second surface. Thus, a wiring pattern is formed. The resist patterns at both surfaces are peeled off. In this way, the method is completed.

The substrate for a semiconductor element manufactured as described above has a structure such that metal is supported by a premold resin. Therefore, even though the thickness of the metal is made small to a level at which fine etching is possible, the etching process can be performed with stability.

However, according to the method for manufacturing a substrate for a semiconductor element described in Japanese Unexamined Patent Application, First Publication No. H10-022440, there is a technical difficulty in the step of applying a premold resin to a surface which was etched midway in a thickness direction of the metal plate. This is because the thickness of the application must be thick enough to provide the necessary rigidity to the substrate, while at the same time, the bottom surface of the connection post must be completely exposed.

A concrete solution for an application while controlling the thickness is, for example, a method in which a syringe and the like is used to pour resin into one point of a bottom of an applied surface, and wait until the resin permeates the entire applied surface or an area wide enough to form a resin with an even thickness. Then, the next resin is poured in. This procedure is repeated. However, the premold resin has a certain level of viscosity. Therefore, it takes time for the premold resin to spread. Hence, there is a problem in terms of productivity.

Further, the premold resin may become spherical due to the effects of surface tension of the premold resin. As a result, the premold resin might cluster in a narrow region. In this case, even if the amount of premold resin that was infused is small, the height might become large, thereby causing a faulty condition. For example, the height might reach the bottom surface of the connection post.

Another solution is to use a dispenser and the like. According to this solution, a small amount of resin is placed in succession to a bottom surface of the application.

However, this solution is also problematic in terms of productivity. In addition, the premold resin may become spherical due to the effects of surface tension of the premold resin. As a result, the premold resin might cluster in a narrow region. In this case, even if the amount of premold resin that was infused is small, the height might become large, thereby causing a faulty condition. For example, there may be an obstruction in connectivity due to the premold resin attaching the bottom surface of the connection post.

A solution to this problem is suggested. According to this solution, for example, when the first surface is filled with a premold resin, the first surface is first filled with resin so that the resin covers the first surface in its entirety. Then, the resin is solidified. Thereafter, the first surface is grinded from above. Thus, the connection post is exposed.

In more concrete terms, based on calculation, premold resin is applied on the first surface. The amount of this premold resin is greater than the amount necessary to fill the first surface. When the premold resin is solidified, a film or a plate-like cover is placed over it. The material of the film is such that the film may be easily peeled off. Further, a pressing operation is performed from above it. Resin is filled in even to a minute part of the first surface. Then, the resin is solidified. Next, the cover is removed. A grinding operation is conducted on the premold resin covering the first surface. A buff, for example, is used in the grinding operation. The premold resin is removed until the upper bottom surface of the connection post is exposed.

In this way, it is possible to obtain a premold resin layer, in a relatively easy manner, having enough thickness to support a substrate. At the same time, this premold resin layer may be obtained so that the connection post is exposed with reliability.

However, there are other solutions as well. In other words, when the premold resin is applied to the first surface, in order for the premold resin to permeate the first surface even to minute portions, it is theoretically necessary to have a greater amount of premold resin compared to the required amount. When this is pressed, the excess resin normally spreads out from where the substrate main body pattern is located. Thus, the excess resin spreads out towards an outer side.

Here, in most cases, within the metal plate that becomes an ingredient, the portion which becomes the substrate main body is assigned and located neat a central part of the ingredient. An alignment mark is placed outside the portion which becomes the substrate main body, or in the peripheral part of the ingredient. The alignment mark is used to make an alignment after the substrate is completed, when components such as semiconductor chips and the like are mounted, or when an attachment is made inside a metal molding and a molding operation is performed, and the like.

The amount of resin applied to the first surface should be calculated so that there is no excess portions. However, the portion spreading outside does not become zero. In some cases, the excess portion spreads widely in a particular direction. In this case, when the excess resin reaches the alignment mark, the excess resin covers up the alignment mark. As a result, there is a problem in that subsequent operations are obstructed.

The present invention is made according to the problems described above. Thus, the present invention provides a semiconductor device and a method for manufacturing a substrate for a semiconductor element, which can easily and reliably solve the problem that, during a process in which the substrate for a semiconductor element having a premold resin is manufactured, excess resin spreads to an outer peripheral part of the ingredient and obstructs alignment marks and the like from operating.

SUMMARY

A manufacturing method of a substrate for a semiconductor element according to a first embodiment of the present invention includes a first step and a second step. Here, the first step includes the steps of: forming a first photosensitive resin layer on a first surface of a metal plate; providing a second photosensitive resin layer on a second surface different from the first surface of the metal plate; forming a first resist pattern on the first surface of the metal plate, for forming a connection post, by selectively performing an exposure to the first photosensitive resin layer according to a first pattern, and by developing the first photosensitive resin layer, the first resist pattern including the first photosensitive resin layer which was developed; and forming a second resist pattern on the second surface of the metal plate, for forming a wiring pattern, by selectively performing an exposure to the second photosensitive resin layer according to a second pattern, and by developing the second photosensitive resin layer, the second resist pattern including the second photosensitive resin layer which was developed. In addition, the second step includes the steps of: performing an etching of the first surface of the metal plate from the first surface to a midway of the metal plate, and forming the connection post on the first surface; filling in a premold liquid resin to the first surface which was etched; forming a premold resin layer by hardening the premold liquid resin; performing a grinding operation on the first surface, and exposing an upper bottom surface of the connection post from the premold resin layer; and performing an etching of the second surface of the metal plate from the second surface, and forming the wiring pattern. Here, a groove structure is formed at a peripheral of a pattern of a main body of the substrate by going through the first step and the second step. A depth of the groove structure is up to an intermediate part in a thickness direction of the metal plate.

According to the first embodiment of the present invention, when the premold resin applied on the substrate main body pattern is pressed via the cover, the resin that spread outside falls into a groove structure before the resin reaches above an alignment mark and the like at a peripheral part of the metal ingredient. Thus, the resin is prevented from spreading any further, In this way, it is possible to prevent the alignment mark from being covered by a resin and the like.

The manufacturing method of a substrate for a semiconductor element according to a second embodiment may be configured as follows: the groove structure is connected and surrounds the pattern of the main body of the substrate.

According to the second embodiment, it is possible to prevent the excess resin from reaching the alignment mark with more reliability.

A semiconductor device according to a third embodiment of the present invention includes: a semiconductor element substrate; and a semiconductor element mounted on the semiconductor element substrate. Here, the semiconductor element substrate includes: a metal plate including a first surface and a second surface different from the first surface; a connection post placed on the first surface of the metal plate; a wiring pattern placed on the second surface of the metal plate; and a premold resin layer placed on a portion of the first surface of the metal plate where the connection post is not placed. An upper bottom surface of the connection post is exposed from the premold resin layer. In addition, a metal wire makes an electrical connection between the semiconductor element substrate and the semiconductor element.

According to the present invention, a premold resin in liquid form covers the entire first surface. Then, excess resin is removed by a grinding operation. In this way, a substrate for a semiconductor element having a premold resin is manufactured. During this procedure, it is possible to prevent the excess resin from spreading to an outer peripheral part of the ingredient. It is also possible to prevent the excess resin from obstructing the structure of a mark used for alignment and the like. These effects can be achieved easily and in a reliable manner.

DETAILED DESCRIPTION OF THE PREFERRED EMBODIMENTS

Hereinafter, a representative example of a method for manufacturing a substrate for a semiconductor element according to a first embodiment of the present invention is described with reference to FIGS. 1A-3.

Working Example

Figure 2:
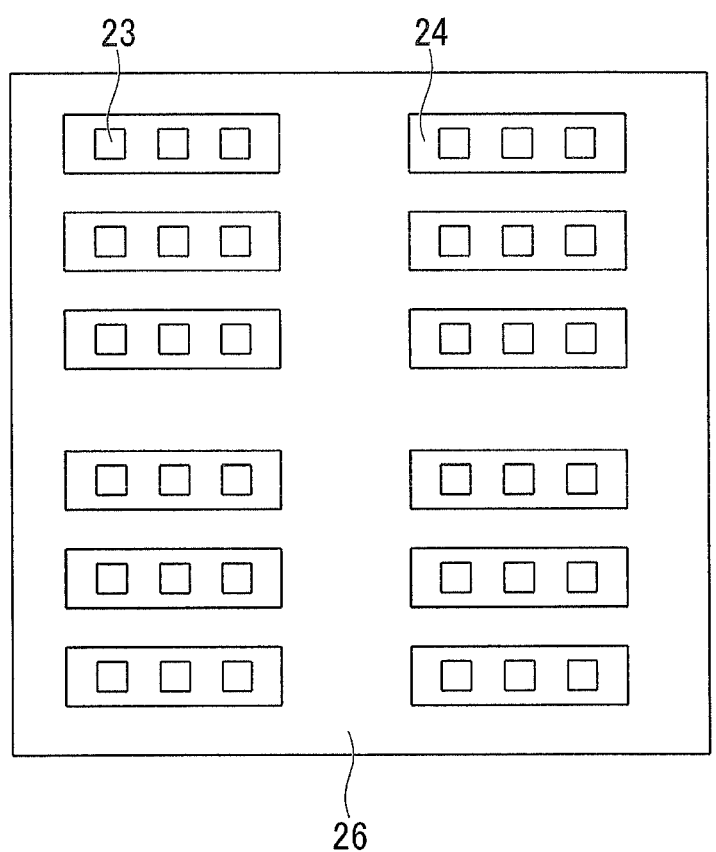
FIG. 2 is a descriptive view schematically showing an example of a positioning inside a copper plate material according to a process for manufacturing a substrate for a semiconductor element based on an embodiment of the present invention.
Figure 3:
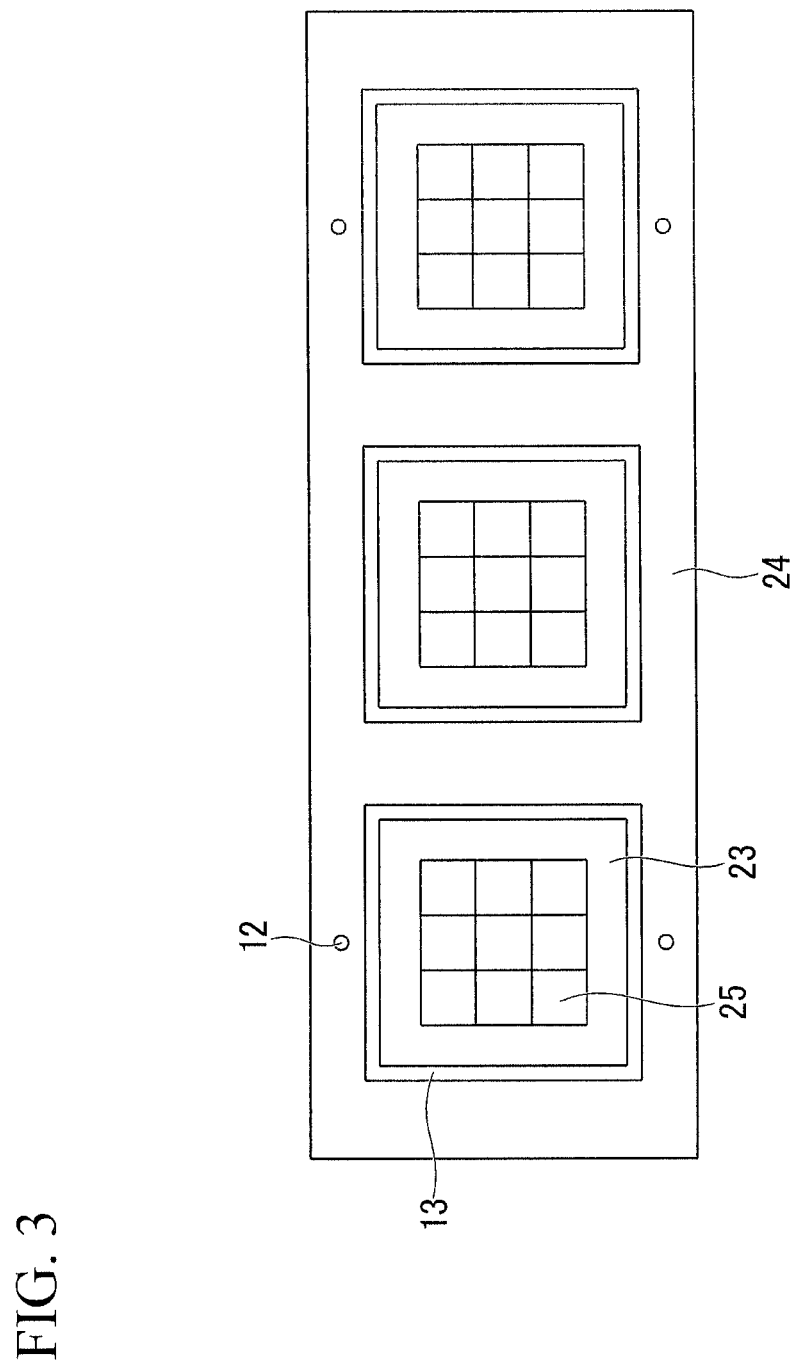
FIG. 3 is a descriptive view schematically showing an example of a positioning 2Q inside a frame according to a process for manufacturing a substrate for a semiconductor element based on an embodiment of the present invention.
Figure 4A:
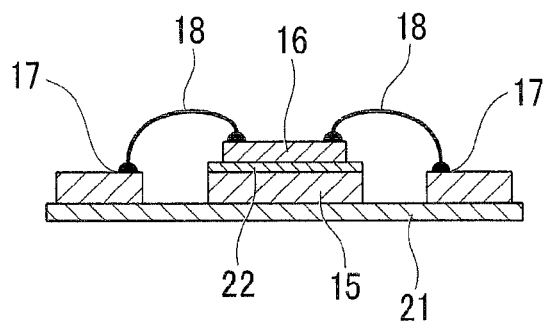
FIG. 4A is a descriptive view schematically showing a conventional substrate for a semiconductor element.
Figure 4B:
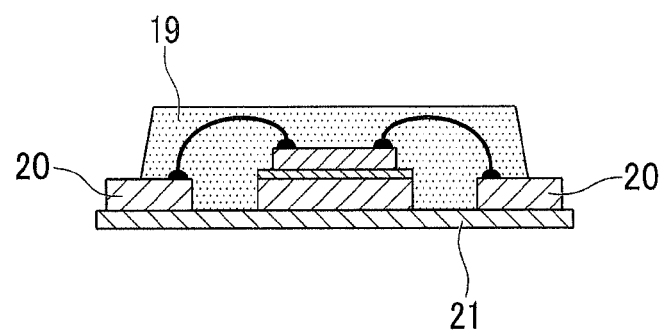
FIG. 4B is a descriptive view schematically showing a conventional substrate for a semiconductor element.
Figure 4C:
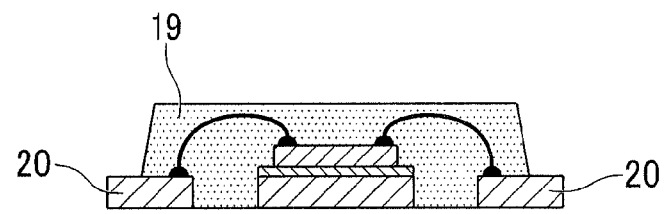
FIG. 4C is a descriptive view schematically showing a conventional substrate for a semiconductor element.

FIG. 2-FIG. 3 schematically shows a positioning in a metal plate 1 which is to become an ingredient. FIG. 2 is a descriptive view schematically showing an example of a positioning inside a copper plate material 26 according to a process for manufacturing a substrate for a semiconductor element based on an embodiment of the present invention. FIG. 3 is a descriptive view schematically showing an example of a positioning inside a frame 24 according to a process for manufacturing a substrate for a semiconductor element based on an embodiment of the present invention. A final shape of a substrate 25 is a square with sides that are 12 mm long. Three rows of three columns of these squares form one set of block 23. One row of three blocks 23 are placed at an 8 mm interval, thereby forming a set of frame 24. In addition, as shown in FIG. 2, the copper plate material 26, which becomes an ingredient, is a square with sides that are 450 m long. Twelve frames 24 are positioned inside the copper plate material 26.

After the substrate is completed, steps such as gold plating, chip mounting, wire bonding, and resin sealing are expected. These steps are performed for each frame 24. Here, the frame 24 serves as one unit.

A circular hole 12 is provided at four places on each frame 24 near an end of a long side (see FIG. 3). The circular hole 12 has a diameter of 0.6 mm. The circular holes 12 are used during an alignment when an entry into a metal mold is made when the resin is sealed.

A groove structure 13 is placed around each block 23. The width of the groove structure 13 is 1 mm. The groove structure 13 is placed at a position dividing the hole 12 from the block 23. The groove structure 13 is made when the first etching process is performed. Hence, the depth of the groove structure 13 is generally the same as other portions which undergoes etching in the first etching process.

Figure 1A:
FIG. 1A is a descriptive view schematically showing an example of a process for manufacturing a substrate for a semiconductor element according to an embodiment of the present invention.
Figure 1B:
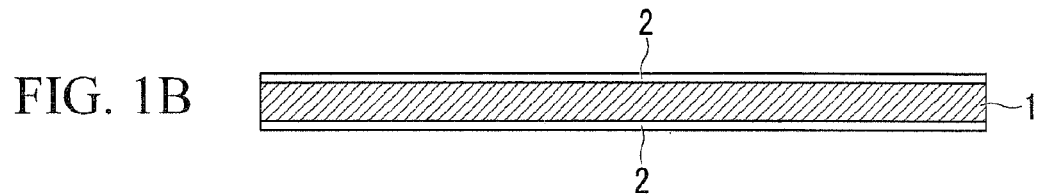
FIG. 1B is a descriptive view schematically showing an example of a process for manufacturing a substrate for a semiconductor element according to an embodiment of the present invention.
Figure 1C:
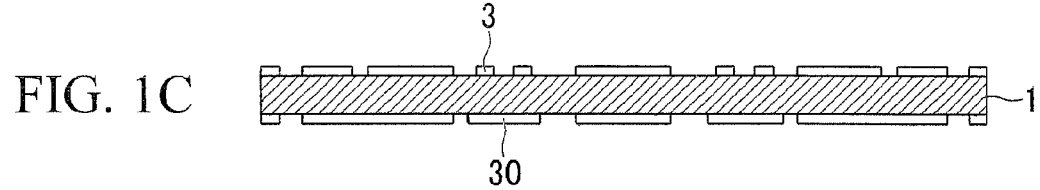
FIG. 1C is a descriptive view schematically showing an example of a process for manufacturing a substrate for a semiconductor element according to an embodiment of the present invention.

Next, the steps of the processing are described. First, as shown in FIG. 1A, a square copper plate material 1 is provided. The length of each of the four sides of the copper plate material 1 is 450 mm, while the thickness of the copper plate material 1 is 200 μm. Next, as shown in FIG. 1B, a photosensitive resist 2 (OFPR4000, manufactured by Tokyo Ohka Kogyo, Co., Ltd.) is coated to both surfaces of the copper plate material 1 with a roll coater. The photosensitive resist 2 is coated so that the thickness of the photosensitive resist 2 is 5 μm. Thereafter, a prebaking is performed at a temperature of 90° C. Next, a pattern exposure is performed from both surfaces via a pattern exposure photo mask. The pattern exposure photo mask has a desired pattern. Thereafter, a processing procedure is conducted using a 1% sodium hydroxide solution. Thereafter, a cleansing is made with water, and a post baking is conducted. In this way, as shown in FIG. 1C, a first resist pattern 3 and a second resist pattern 30 were obtained. Incidentally, a first resist pattern 3 is formed on one surface side (i.e., a surface which is opposite to a surface on which a semiconductor element 10 is mounted; hereinafter, the "one surface side" is referred to as a first surface side) of the copper plate material 1 in order to form a connection post 4. A second resist pattern 30 is formed on another surface side (hereinafter referred to as a second surface side) of the copper plate material 1 in order to create a wiring pattern 9.

Next, after the second surface side of the copper plate material 1 is protected by covering the entire second surface side with a back sheet, a ferric chloride solution is used to perform a first etching procedure from the first surface side of the copper plate material 1. The thickness of a portion of the copper plate material 1 which is exposed from the first resist pattern 3 at the first surface side is made thinner to 30 μm. The specific weight of the ferric chloride solution is 1.48. The temperature of the ferric chloride solution is 50° C. An etching procedure is not performed on a portion at which the first resist pattern 3 is created for forming the connection post 4. Therefore, it is possible to form a connection post 4 which can establish an external connection with a print substrate. The connection post 4 is elongated in the thickness direction of the copper substrate 1. The height of the connection post 4 is from the etching surface, created by the first etching process, to a lower side surface of the copper substrate 1.

Figure 1D:
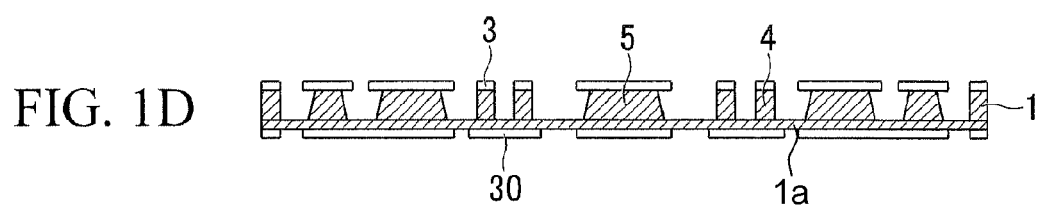
FIG. 1D is a descriptive view schematically showing an example of a process for manufacturing a substrate for a semiconductor element according to an embodiment of the present invention.

Incidentally, during the first etching process, only a partial etching is performed. In other words, the first etching process does not completely dissolve and remove the portion of the copper substrate 1 at which an etching is performed. The first etching is finished when a predetermined thickness of the copper substrate 1 is reached. A portion 1a of copper substrate 1 below the etching surface remains after the etching, as shown in FIG 1D, for example.

Figure 1E:
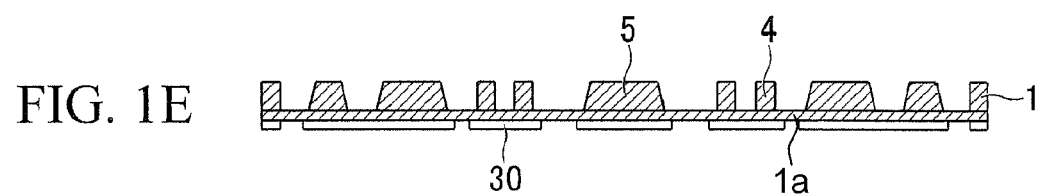
FIG. 1E is a descriptive view schematically showing an example of a process for manufacturing a substrate for a semiconductor element according to an embodiment of the present invention.

Next, as shown in FIG. 1E, the first resist pattern 3 was peeled off using a 20% aqueous sodium hydroxide with respect to the first surface. The temperature of the peeling liquid is 100° C.

Figure 1F:
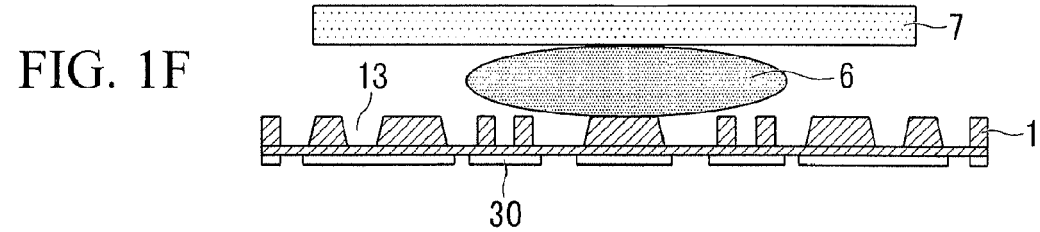
FIG. 1F is a descriptive view schematically showing an example of a process for manufacturing a substrate for a semiconductor element according to an embodiment of the present invention.

Next as shown in FIG. 1F, a premold resin 6 in liquid form is placed near a central part of each block of the first surface. A goal of the amount of the premold resin 6 in liquid form is an amount adequate enough to cover each block and preferably does not stick out of the block. Based on experimentation results, the amount of the premold resin 6 in liquid form is 1.6 times a computed value minimally necessary to cover each block. The premold resin 6 in liquid form was placed on all blocks. Then, a cover film 7 was placed on each frame. A fluorine resin type plastic film was used as a material of the cover film 7 so that the cover film 7 can be easily peeled off from the premold resin 6 in liquid form.

Next, a pressing operation was performed on the copper plate material 1 via the cover frame 7. The pressing operation was conducted in a direction in which the premold resin 6 in liquid form is embedded in a concave portion of the first surface. A vacuum pressurized laminated device was used for the pressing operation. The temperature of the pressing part was set to be 70° C. The atmospheric pressure inside the vacuum chamber was set to be 0.2 ton. The pressing time was 90 seconds. Under this condition, the pressing operation was conducted. On the first surface, a portion of the premold resin 6 in liquid form stuck out from inside the block to an external part. However, since it fell into a groove part 13, no more premold resin stuck out. In addition, by performing a pressing operation inside a vacuum chamber, an air gap formed inside the premold resin layer in liquid form can be eliminated, thereby preventing the occurrence of a void inside the resin.

Figure 1G:
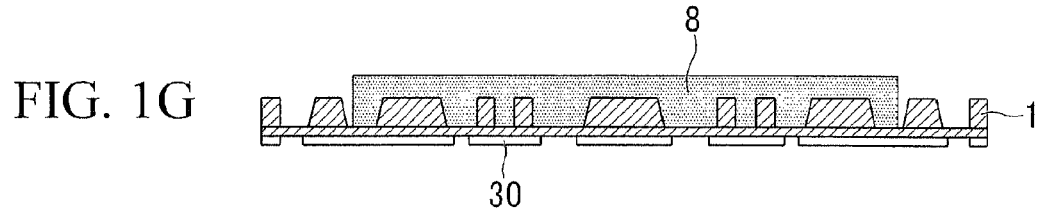
FIG. 1G is a descriptive view schematically showing an example of a process for manufacturing a substrate for a semiconductor element according to an embodiment of the present invention.

Next, a heating and hardening of the premold resin 6 in liquid form was conducted. The heating and hardening process was performed in two stages. First, one hour of processing was conducted inside an oven heated to 90° C. When the premold resin 6 in liquid form was partially hardened, the cover film was removed. Next, three hours of processing was conducted inside an oven heated to 150° C. As a result, the block on the first surface and a peripheral part of the block was covered with a hardened premold resin layer 8. The height of the premold resin layer 8 is 20 μm above an upper bottom surface of the connection post (FIG. 1G).

Figure 1H:
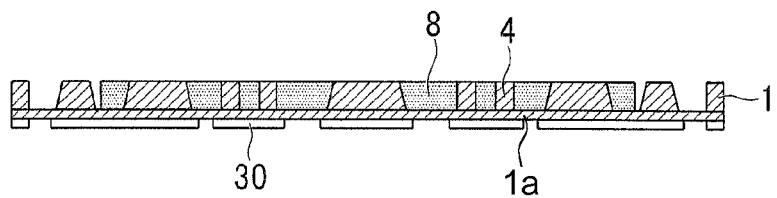
FIG. 1H is a descriptive view schematically showing an example of a process for manufacturing a substrate for a semiconductor element according to an embodiment of the present invention.

Next, as shown in FIG. 1H, a grinding operation was conducted to the premold resin layer 8 on the first surface. A buffalo rotation type grinding device was used for this grinding operation. A thread size of the buffalo corresponding to 800 was used. The grinding operation was conducted until an upper bottom surface of the connection post 4 of the first surface was completely exposed.

Figure 1I:
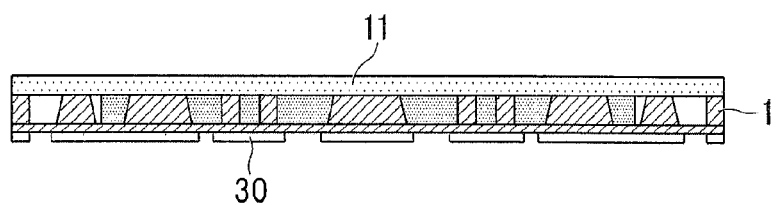
FIG. 1I is a descriptive view schematically showing an example of a process for manufacturing a substrate for a semiconductor element according to an embodiment of the present invention.
Figure 1J:
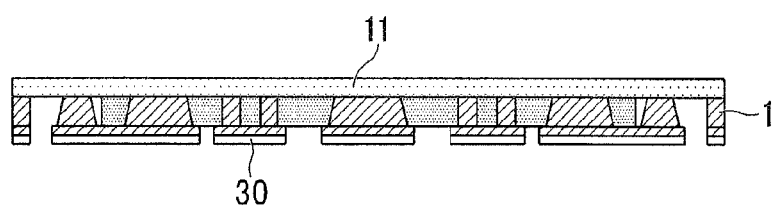
FIG. 1J is a descriptive view schematically showing an example of a process for manufacturing a substrate for a semiconductor element according to an embodiment of the present invention.
Figure 1K:
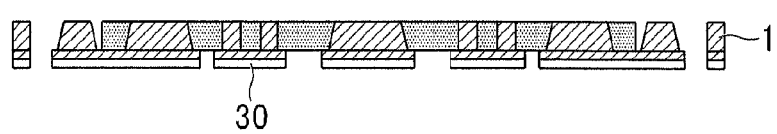
FIG. 1K is a descriptive view schematically showing an example of a process for manufacturing a substrate for a semiconductor element according to an embodiment of the present invention.

Next, as shown in FIG. 1I, the first surface was protected by covering the entire first surface with a cover film 11. Then, as shown in FIG. 1J, an etching process was performed on the second surface. A ferric chloride solution was used as the etching liquid. The specific weight of the etching liquid was 1.48. The temperature of the etching liquid was 50° C. A goal of the etching process is to form a wiring pattern 9 on the second surface. The copper plate material 1, which was exposed from the second resist pattern 30 over the second surface, was dissolved and removed. Next, as shown in FIG. 1K, the cover film 11 on the first surface was peeled and removed. During the pressing operation of the premold resin 6 in liquid form, the groove structure 13 in the peripheral of the block trapped the resin which stuck out from inside the block. As a result, after the etching operation of the second surface, an alignment mark is processed near the outer peripheral of the frame. In this way, the penetrating hole 12 for alignment was created. The hole 12 is of a predetermined size.

Figure 1L:
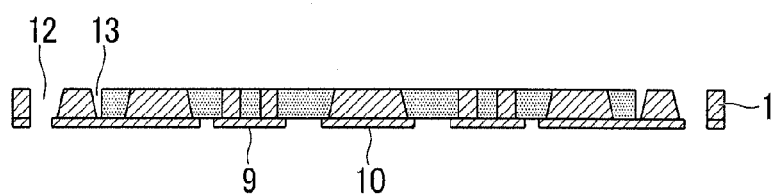
FIG. 1L is a descriptive view schematically showing an example of a process for manufacturing a substrate for a semiconductor element according to an embodiment of the present invention.
Figure 1M:
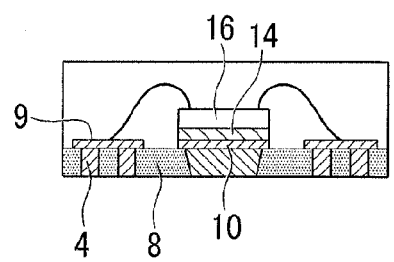
FIG. 1M is a descriptive view schematically showing an example of a process for manufacturing a substrate for a semiconductor element according to an embodiment of the present invention.

Next, as shown in FIG. 1L, the second resist pattern 30 of the second surface was peeled off. The peeling liquid is a 20% aqueous sodium hydroxide. The temperature of the peeling liquid is 100° C.

After a processing was conducted to this stage, the copper plate material 1 was cut at a unit of each frame.

Next, for each frame, a surface processing was conducted on the exposed metal surface. The surface processing was conducted using a non-electrolytic nickel/palladium/gold plating forming method. An electrolytic plating method may be used to form a plated layer on a lead frame.

However, when an electrolytic plating method is used, it is necessary to form a plating electrode in order to supply a plating current. Thus, since the plating electrode is formed, the wired region becomes smaller. Hence, there is a concern that the wiring may become difficult. Therefore, the present working example used the non-electrolytic nickel/palladium/gold plating forming method, which does not require an electrode for supplying a plating current.

In other words, the plated layer was formed by conducting on the metallic surface, an acid delipidation, a soft etching, acid cleansing, a platinum catalyzer activation procedure, a pre-dipping, a non-electrolytic platinum plating, and a non-electrolytic gold plating. The thickness of the nickel plating is 3 μm, the thickness of the palladium plating is 0.2 μm, and the thickness of the gold plating is 0.03 μm. Enplate NI (manufactured by Meltex Inc.) was used as the plating liquid for nickel plating. Paulobond EP (manufactured by Rohm and Haas) was used as the plating liquid for palladium plating. Paulobond IG (manufactured by Rohm and Haas) was used as the plating liquid for gold plating.

Next, the semiconductor element 16 was bonded and mounted on the surface 10 of an island 5 of each substrate for a semiconductor element inside each frame. Here, a bonding adhesive or a bonding tape 14 was used. Thereafter, a wire bonding was performed on an electrical connection terminal of the semiconductor element 16 and a predetermined part of the wiring pattern (a land for wire bonding). This wire bonding was performed using a metallic fine line. Then, a molding was performed so as to cover the lead frame and the semiconductor element. Thus, individual semiconductor substrates were obtained.

Thereafter, a cutting operation was performed on the semiconductor substrate which was attached to a surface. In this way, individual semiconductor substrates were obtained.

According to a semiconductor device and a method for manufacturing a substrate for a semiconductor element based on the present working example, when a substrate for a semiconductor element provided with a premold is manufactured, it was possible to easily and reliably prevent the problem of excess resin spreading out to an outer peripheral part of the ingredient causing a disruption in the operation of the alignment mark and the like, as expected.

A favorable working example according to the present invention has been described above. However, the description provided above only presents an example of the present invention. The technical scope of the present invention is not limited by the embodiments described above. Various alterations may be made without deviating from the gist of the present invention. In other words, the present invention is not to be limited to the working example presented above, and is limited by the attached claims.

According to the present invention, after the entire first surface is covered with a premold resin in liquid form, excess resin is removed by a grinding procedure. In this way, during a procedure of manufacturing a substrate for a semiconductor element provided with a premold, it is possible to easily and reliably prevent the problem of excess resin spreading out to an outer peripheral part of the ingredient causing a disruption in the operation of a mark and the like used for alignment and the like.

What is claimed is:

1. A manufacturing method of a substrate for a semiconductor element, the manufacturing method comprising: a first process and a second process,
   the first process comprising
      forming a first photosensitive resin layer on a first surface of a metal plate;
      providing a second photosensitive resin layer on a second surface different from the first surface of the metal plate;
      forming a first resist pattern on the first surface of the metal plate, for forming a connection post, by selectively performing an exposure to the first photosensitive resin layer according to a first pattern, and by developing the first photosensitive resin layer, the first resist pattern comprising the first photosensitive resin layer which was developed; and
      forming a second resist pattern on the second surface of the metal plate, for forming a wiring pattern, by selectively performing an exposure to the second photosensitive resin layer according to a second pattern, and by developing the second photosensitive resin layer, the second resist pattern comprising the second photosensitive resin layer which was developed; and
   the second process comprising
      performing an etching of the first surface of the metal plate from the first surface to a midway of the metal plate, and forming the connection post on the first surface;
      filling in a premold liquid resin to the first surface which was etched;
      forming a premold resin layer by hardening the premold liquid resin;
      performing a grinding operation on the first surface, and exposing an upper bottom surface of the connection post from the premold resin layer; and
      performing an etching of the second surface of the metal plate from the second surface, and forming the wiring pattern, wherein
      a groove structure is formed at a peripheral of a pattern of a main body of the substrate by going through the first step and the second step, wherein a depth of the groove structure is up to an intermediate part in a thickness direction of the metal plate.

2. The manufacturing method of a substrate for a semiconductor element according to claim 1, wherein the groove structure is connected and surrounds the pattern of the main body of the substrate.

3. A semiconductor device comprising:
   a semiconductor element substrate having a first surface and a second surface different from the first surface; and
   a semiconductor element mounted on the second surface of the semiconductor element substrate,
   the semiconductor element substrate comprising a connection post placed on the first surface of the semiconductor element substrate,
a wiring pattern placed on the second surface of the semiconductor element substrate, and
a premold resin layer placed on a portion of the first surface of the semiconductor element substrate where the connection post is not placed,
the connection post having an upper bottom surface exposed from the premold resin layer, and
a metal wire making an electrical connection between the semiconductor element substrate and the semiconductor element.

\* \* \* \* \*